United States Patent
Tanaka et al.

(10) Patent No.: US 6,927,139 B2
(45) Date of Patent: Aug. 9, 2005

(54) NONVOLATILE SEMICONDUCTOR MEMORY AND MANUFACTURING METHOD FOR THE SAME

(75) Inventors: Masayuki Tanaka, Yokohama (JP); Atsuhiro Sato, Yokohama (JP); Hiroki Yamashita, Yokohama (JP); Ichiro Mizushima, Yokohama (JP); Yoshio Ozawa, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/717,719

(22) Filed: Nov. 21, 2003

(65) Prior Publication Data
US 2005/0003619 A1 Jan. 6, 2005

(30) Foreign Application Priority Data
Jul. 4, 2003 (JP) ......................................... 2003-192495

(51) Int. Cl.[7] ............................................ H01L 21/336
(52) U.S. Cl. ........................................ 438/294; 438/589
(58) Field of Search .................................. 438/183, 257, 438/294, 296, 589, 683, 684, 685

(56) References Cited

U.S. PATENT DOCUMENTS

| | | | | |
|---|---|---|---|---|
| 5,578,516 A | * | 11/1996 | Chou | 438/253 |
| 5,792,689 A | * | 8/1998 | Yang et al. | 438/253 |

FOREIGN PATENT DOCUMENTS

JP      2001-15616      1/2001

* cited by examiner

*Primary Examiner*—Phuc T. Dang
(74) *Attorney, Agent, or Firm*—Oblon, Spivak, McClelland, Maier & Neustadt, P.C.

(57) ABSTRACT

A semiconductor memory encompasses a memory cell matrix, which embraces device isolation films running along the column-direction, arranged alternatively between the cell columns; first conductive layers having top surfaces lower than the device isolation films; inter-electrode dielectrics arranged on the corresponding first conductive layers, the inter-electrode dielectric has a dielectric constant larger than that of silicon oxide; and second conductive layers running along the row-direction, each of the second conductive layers arranged on the inter-electrode dielectric and the device isolation films so that the second conductive layer can be shared by the memory cell transistors arranged along the row-direction belonging to different cell columns.

20 Claims, 9 Drawing Sheets

NONVOLATILE SEMICONDUCTOR MEMORY AND MANUFACTURING METHOD FOR THE SAME

CROSS REFERENCE TO RELATED APPLICATIONS

This application claims benefit of priority under 35 USC 119 based on Japanese Patent Application No. P2003-192495 filed Jul. 4, 2003, the entire contents of which are incorporated by reference herein.

BACKGROUND OF THE INVENTION

1. Field of the Invention

The present invention relates to a semiconductor memory and a fabrication method of the semiconductor memory. It is particularly related to a miniaturized nonvolatile semiconductor memory encompassing a plurality of memory cell transistors, each of the memory cell transistors being implemented by a gate electrode structure, which encompasses an inter-electrode dielectric sandwiched between a first conductive layer and a second conductive layer. The semiconductor memory encompasses a plurality of cell columns, each of the cell columns embracing serially connected memory cell transistors, and the cell columns being arranged very close to each other.

2. Description of the Related Art

The inter-cell spacing of semiconductor memories is decreasing at approximately a 30% per annum in order to achieve high integration and miniaturization. There are concerns of increasing inter-cell coupling accompanying with adoption of an inter-electrode dielectric having a higher dielectric constant, as an architecture for resolving problems associated with the decrease in inter-cell spacing and its concurrent problems.

Earlier nonvolatile semiconductor memories have been implemented by a polysilicon first conductive layer, which serves as a floating gate electrode. The information of a cell is configured to be stored in the first conductive layer, by retaining electrical charges in the first conductive layer (floating gate electrodes). Therefore, between a 'written cell' retaining electrical charges and an 'erased cell' not retaining electrical charges in a miniaturized nonvolatile semiconductor memory, a so-called "inter-cell coupling" increases as the inter-cell spacing decreases. Thus, a method of controlling inter-cell coupling by doping device isolation films with fluorine so as to reduce the dielectric constant is proposed, as disclosed in Japanese Patent Application Laid-open No. 2001-15616.

Meanwhile, as a result of decreasing the inter-cell spacing even more than before, increasing the capacitor area by employing a three-dimensional structure that has adopted an ONO film as the inter-electrode dielectric formed between the first conductive layer (floating gate electrodes) and the second conductive layer (control gate electrodes) becomes impossible. The ONO film embraces a triple layer film of a silicon oxide film ($SiO_2$ film), a silicon nitride film ($Si_3N_4$ film), and a silicon oxide film ($SiO_2$ film). Thus, in order to implement the miniaturized nonvolatile semiconductor memory, it is necessary to use an insulating film with a higher dielectric constant than before as the inter-electrode dielectric.

Since usage of a high dielectric constant insulating film allows increased capacitance without decreasing the film thickness, there are expectations of no increase in leakage currents and no need of a three-dimensional structure. Furthermore, the fabrication process will become simplified because a three-dimensional structure is no longer necessary, whereby as a result, it is expected that a device with high performance will be fabricated, the fabrication method thereof will be simplified, and implementation of a high yielding fabrication process will be possible.

A structural cross sectional view of a memory cell transistor of an earlier nonvolatile semiconductor memory viewed from a direction perpendicular to bit lines in a stage where up to the inter-electrode dielectric has been stacked is shown in FIG. 1.

As shown in FIG. 1, the memory cell transistor of the earlier nonvolatile semiconductor memory provokes a problem since the inter-cell coupling (C1 in FIG. 1) between the first conductive layers (floating gate electrodes) 3 increases as the inter-cell spacing decreases.

In addition, employment of an inter-electrode dielectric 8e made from a material with a higher dielectric constant than that of silicon oxide causes the electric field arising from accumulated electric charge in the 'written cell' to spread to adjacent cells via the inter-electrode dielectric 8e so that the 'written cell' capacitively couples to the adjacent cells (see C2 in FIG. 1). In the case where the relative dielectric constant $\in_r$ of the inter-electrode dielectric 8e is higher than that of the silicon oxide film, the inter-cell coupling C2 is greater than C1, so that the problem of the inter-cell coupling C2 is even more serious.

Consequently, in light of the above discussion, although employment of the insulating film with a higher dielectric constant for the inter-electrode dielectric 8e is required, the development of a controlling architecture of inter-cell coupling through the inter-electrode dielectric is necessary for implementing a miniaturized, highly integrated, and highly efficient nonvolatile semiconductor memory. In the controlling architecture of the inter-cell coupling in the miniaturized nonvolatile semiconductor memory, a structure such that the inter-electrode dielectric 8e extends along the length of word lines as shown in FIG. 1 cannot be employed.

SUMMARY OF THE INVENTION

An aspect of present invention inheres in a semiconductor memory comprising a memory cell matrix including a plurality of cell columns arranged along a row-direction, each of cell columns is implemented by a plurality of memory cell transistors serially arranged along a column-direction. Here, the memory cell matrix encompasses (a) a plurality of device isolation films running along the column-direction, arranged alternatively between the cell columns, (b) a plurality of first conductive layers having top surfaces lower than the level of top surfaces of the device isolation films, arranged along the row and column-directions, a group of the first conductive layers arranged along the column-direction is assigned to a corresponding cell column, adjacent groups of the first conductive layers assigned to adjacent cell columns are isolated from each other by the device isolation film disposed between the adjacent groups, (c) a plurality of inter-electrode dielectrics arranged selectively and respectively on the corresponding first conductive layers, the inter-electrode dielectric has a dielectric constant larger than that of silicon oxide, and (d) a plurality of second conductive layers running along the row-direction, each of the second conductive layers arranged on the inter-electrode dielectric and the device isolation films so that the second conductive layer can be shared by the memory cell transistors arranged along the row-direction belonging to different cell columns.

Another aspect of present invention inheres in a method for manufacturing a semiconductor memory comprising a memory cell matrix including a plurality of cell columns arranged along a row-direction, each of cell columns is implemented by a plurality of memory cell transistors serially arranged along a column-direction. That is, the method encompasses:

(a) forming a periodic structure implemented by first and second ridges, both running alternately along the column-direction, each of the first ridges is made of device isolation film and each of the second ridges is made of one of protruding portions of a semiconductor substrate, a cell site gate insulator on the protruding portion of the semiconductor substrate and a first conductive layer on the cell site gate insulator, the top surface of the second ridges is lower than the top surface of the first ridges, each of the second ridges is assigned to a corresponding cell column;

(b) forming a plurality of inter-electrode dielectrics on the corresponding first conductive layers such that adjacent inter-electrode dielectrics are isolated by one of the first ridges, the inter-electrode dielectric has a dielectric constant larger than that of silicon oxide; and (c) forming a plurality of second conductive layers running along the row-direction, each of the second conductive layers arranged on the inter-electrode dielectric and the device isolation films so that the second conductive layer can be shared by the memory cell transistors arranged along the row-direction belonging to different cell columns.

BRIEF DESCRIPTION OF THE DRAWINGS

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

Generally and as it is earlier in the representation of semiconductor devices, it will be appreciated that the various drawings are not drawn to scale from one figure to another nor inside a given figure, and in particular that the layer thicknesses are arbitrarily drawn for facilitating the reading of the drawings.

DETAILED DESCRIPTION OF THE EMBODIMENTS

In the following description specific details are set forth, such as specific materials, process and equipment in order to provide a thorough understanding of the present invention. It will be apparent, however, to one skilled in the art that the present invention may be practiced without these specific details. In other instances, well-known manufacturing materials, process and equipment are not set forth in detail in order not unnecessary obscure the present invention.

Prepositions, such as "on", "over" and "under" are defined with respect to a planar surface of the substrate, regardless of the orientation in which the substrate is actually held. A layer is on another layer even if there are intervening layers.

(First Embodiment)

Figure 1:
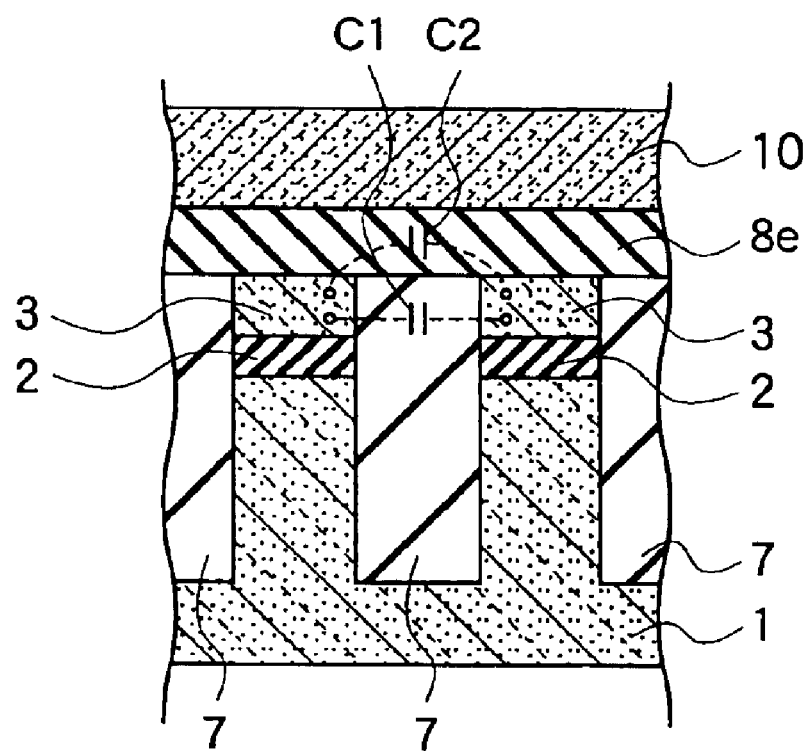
FIG. 1 is a schematic cross sectional view showing a portion of a memory cell matrix of an earlier semiconductor memory.
Figure 2:
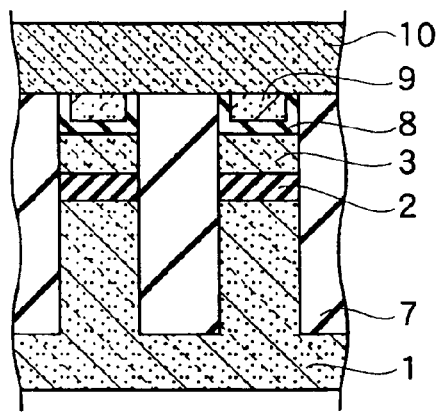
FIG. 2 is a schematic cross sectional view cut along the word line length showing a portion of a memory cell matrix of a semiconductor memory according to the first embodiment of the present invention.
Figure 3A:
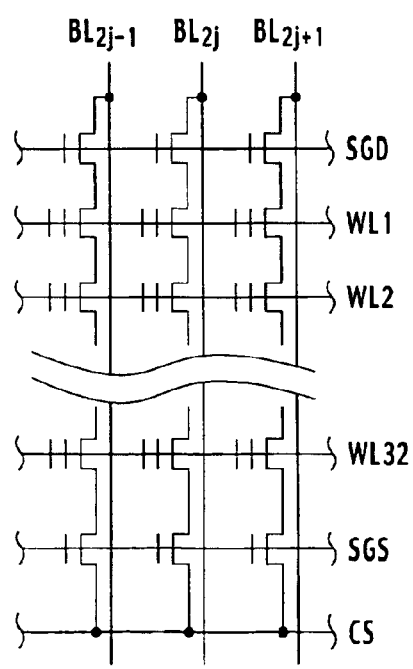
FIG. 3A is an equivalent circuit showing a portion of a memory cell matrix of the semiconductor memory according to the first embodiment of the present invention.
Figure 3B:
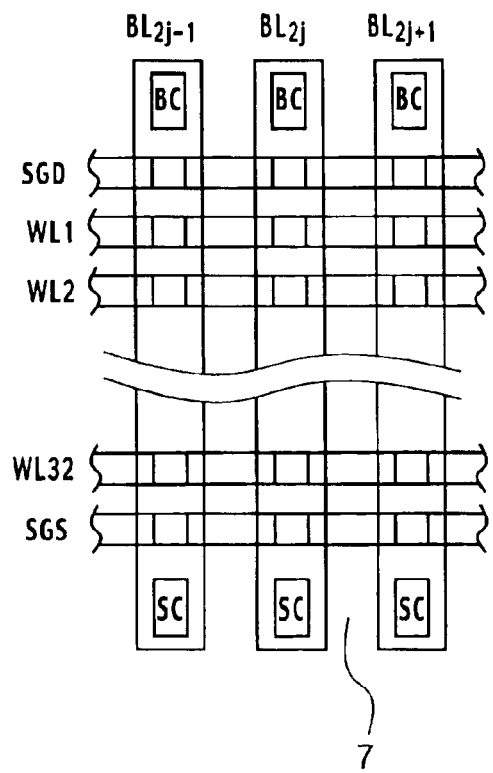
FIG. 3B is a schematic plan view showing the portion of the memory cell matrix corresponding to FIG. 3A.

A semiconductor memory according to a first embodiment of the present invention, as shown in FIGS. 2, 3A and 3B, is NAND flash memory encompassing a memory cell matrix embracing plural cell columns extending along a column-direction, the cell columns being arranged along a row-direction in parallel. Each of cell columns is implemented by plural memory cell transistors serially arranged along the column-direction. Each of the memory cell transistors has a charge accumulation layer whose electric charge accumulation level is configured to be controlled separately. FIG. 2 is a cross sectional view cut along the length of word lines WL1 through WL32 shown in FIGS. 3A and 3B, thus FIGS. 3A and 3B is described first. The horizontal lines connected to all the memory cell transistors in a row are called the word lines WL1 through WL32.

In other words, the semiconductor memory according to the first embodiment of the present invention, as shown in FIGS. 3A and 3B, encompasses plural word lines WL1, WL2, ... WL32 arranged along the row-direction, and plural bit lines $BL_{2j-1}$, $BL_{2j}$, $BL_{2j+1}$, ... arranged along the column-direction orthogonal to these word lines WL1, WL2, ... WL32. The vertical lines $BL_{2j-1}$, $BL_{2j}$, $BL_{2j+1}$, ..., along which the data flow in and out of the memory cell transistors, are called the bit lines. In addition, memory cell transistors, which have respective charge accumulation layers whose electric charge accumulation levels can be controlled separately using plural word lines WL1, WL2, ...

WL32, are arranged along the row-direction in FIGS. 3A and 3B. FIGS. 3A and 3B illustrate the case where 32 memory cell transistors are arranged along the column-direction so as to implement each of the cell columns. A pair of select transistors, which select a group of memory cell transistors serially arranged in the cell column, are arranged at both ends of respective cell columns. The plural cell columns are arranged in parallel, close to each other. Upper select gate line SGD is connected to the respective gates of upper select transistors. Lower select gate line SGS is connected to the respective gates of the lower select transistors. The drain electrode of the upper select transistors are connected to the corresponding bit lines $BL_{2j-1}$, $BL_{2j}$, $BL_{2j+1}$, . . . . The source electrode of the upper select transistors are connected to the drain electrodes of the uppermost memory cell transistor in the corresponding cell columns. The drain electrode of the lower select transistors are connected to the source electrodes of the lowermost memory cell transistor in the corresponding cell columns, and the source electrode of the lower select transistors are connected to the common source line CS. As it will be appreciated, the terms drain and source can be exchanged without modifying the structure itself.

As shown in FIG. 2, the memory cell matrix of the semiconductor memory according to the first embodiment encompasses a semiconductor substrate 1, multiple device isolation films 7 that the bottom portions are embedded in trenches defined by ridges, each of the ridges is implemented by a protruding portion of the semiconductor substrate 1, a cell site gate insulators 2, which is isolated from neighboring cell site gate insulators 2 by the device isolation film 7, and a first conductive layer 3. The multiple device isolation films 7 formed into rectangular ridges, as shown in FIG. 3B, run parallel to each other like walls, or ridges, between each of the multiple memory cell columns. The cell site gate insulators 2 are isolated from each other by the device isolation films 7, and are formed on the top surface of the protruding portion of the semiconductor substrate 1 so as to implement part of memory cell transistors belonging to mutually adjacent memory cell columns, respectively. Moreover, the first conductive layers 3 are isolated from each other by the ridges of the device isolation films 7, and are formed upon the cell site gate insulators 2 so as to implement part of the memory cell transistors belonging to mutually adjacent memory cell columns, respectively. Each of the first conductive layers (floating gate electrodes) 3 has a topology of a rectangular parallelepiped, and isolated rectangular parallelepipeds are arranged along the column and row-directions. In this case, the top surface of the first conductive layers 3 is at a lower position than the top surface of the device isolation films 7, as shown in FIG. 2.

With the semiconductor memory according to the first embodiment, a plurality of inter-electrode dielectrics 8 are arranged on a top surface of the first conductive layers 3, respectively, and are isolated from each other by the device isolation films 7. The inter-electrode dielectrics 8 implement part of the memory transistors belonging to mutually adjacent memory cell columns, respectively. In addition, as shown in FIG. 2, a second conductive layer 10 is arranged upon the inter-electrode dielectrics 8 of respective memory cell columns, and the bottom surface of that second conductive layer makes contact with the top surface of the device isolation films 7. The second conductive layer 10 is formed continuously so as to become a common interconnect to adjacent memory cell columns. As understood by FIG. 3B, actually, a plurality of the second conductive layers 10 run along the row-direction so as to become a plurality of common interconnects to adjacent memory cell columns. The shape of the each of the second conductive layer 10 is cut into a ridge shape.

The inter-electrode dielectrics 8 are embedded in the spaces or the level difference portions of the top surface of each device isolation films 7 and the top surface of each first conductive layers 3, as shown in FIG. 2. Each of these inter-electrode dielectrics 8 has a thinner film thickness than the level difference portion of the top surface of each device isolation film 7 and the top surface of each first conductive layer 3, and is embedded in the space on top surface of the first conductive layer 3 while contacting the sidewall of the device isolation film 7 and the top surface of the first conductive layer 3. An auxiliary conductive layer 9 is also further embedded in the space implemented by the top surface of each of the inter-electrode dielectrics 8 and the bottom surface of the device isolation film 7.

It is preferable that material for the 'high dielectric constant insulating film' used as the inter-electrode dielectrics has a higher relative dielectric constant $\in_r$ than the silicon oxide film ($SiO_2$ film) relative dielectric constant $\in_r=3.8-4$. It is especially preferable that the material has an even higher relative dielectric constant than the relative dielectric constant $\in_r 5-5.5$ obtained with the earlier ONO film. For example, a single layer film made from any one of a strontium oxide (SrO) film with $\in_r=6$, a silicon nitride ($Si_3N_4$) film with $\in_r=7$, an aluminum oxide ($Al_2O_3$) film with $\in_r=8-11$, a magnesium oxide (MgO) film with $\in_r=10$, an yttrium oxide ($Y_2O_3$) film with $\in_r=16-17$, a hafnium oxide ($HfO_2$) film with $\in_r=22-23$, a zirconium oxide ($ZrO_2$) film with $\in_r=22-23$, a tantalum oxide ($Ta_2O_5$) film with $\in_r=25-27$, or a bismuth oxide ($Bi_2O_3$) film with $\in_r=40$, or a composite film embracing at least two of these plural layers thereof may be used. $Ta_2O_5$ and $Bi_2O_3$ show disadvantages in lacking thermal stability at the interface with the polysilicon. Furthermore, it may be a composite film made from a silicon oxide film and these films. The composite film may have a stacked structure of triple-levels or more. In other words, it should be an insulating film containing a material with the relative dielectric constant $\in_r$ of 6 or greater in at least a portion thereof. However, in the case of a composite film, selecting a combination that results in having an effective relative dielectric constant $\in_{reff}$ of 6 or greater measured for the entire film is preferred. An effective relative dielectric constant $\in_{reff}$ of less than 6 is approximately the same as that of the ONO film, whereby effectiveness greater than with the ONO film cannot be expected. However, the ONO film can also facilitate the establishment of the inter-electrode dielectric 8 in some cases. Moreover, it may also be an insulating film made from an oxide film of a ternary compound such as a hafnium aluminate (HfA10) film. In other words, an oxide containing at least one of the elements: strontium (Sr), aluminum (Al), magnesium (Mg), yttrium (Y), hafnium (Hf), zirconium (Zr), tantalum (Ta), and bismuth (Bi), or a silicon nitride containing these elements may be used as the inter-electrode dielectric. It should be noted that a ferroelectrics such as strontium titanate ($SrTiO_3$) or barium strontium titanate ($BaSrTiO_3$) is available as the high dielectric constant insulating film material; however, a lack of thermal stability at the interface with the polysilicon and hysteresis characteristics of the ferroelectrics must be considered.

With the semiconductor memory according to the first embodiment of the present invention, a structure of memory cell matrix encompassing the memory cell transistors, in which the inter-cell couplings due to the inter-electrode dielectrics 8 are suppressed to a minimum is achieved.

A fabrication method of the semiconductor memory according to the first embodiment is described referencing FIGS. 4A to 4E. The cross sectional views cut along the length of the bit lines $BL_{2j-1}$, $BL_{2j}$, $BL_{2j+1}$, . . . shown in FIGS. 3A and 3B are omitted from FIGS. 4A to 4E. It should be noted that the fabrication method of the semiconductor memory according to the first embodiment given below is merely an example, and other various fabrication methods including this modified example may naturally be implemented.

(a) To begin with, a cell site gate insulator 2 with a thickness of approximately 1 to 15 nm is formed on a semiconductor substrate 1, which is implemented by a p-type silicon substrate. The semiconductor substrate 1 may be an n-type silicon substrate in which p-wells are formed. A first conductive layer 3 with a thickness of approximately 10 to 200 nm, which will be divided into a plurality of floating gate electrodes, is formed on the cell site gate insulator 2 through chemical vapor deposition (CVD). Furthermore, a silicon nitride film 4, which becomes an end point monitoring film, is formed with a thickness of approximately 50 to 200 nm through CVD. The end point monitoring film 4 is not limited to a silicon nitride film so long as the material has etching behavior (etching characteristics) differing from that of device isolation films. In this case, since a silicon oxide film is assumed as the device isolation films 7, a silicon nitride film is suitable for the end point monitoring film 4. Subsequently, a silicon oxide film 5, which becomes a masking film, is then formed with a thickness of approximately 50 to 400 nm through CVD. The masking film 5 is not limited to a silicon nitride film so long as the material has etching behavior (etching characteristics) equal to that of the device isolation films 7. In this case, since a silicon oxide film is adopted as the device isolation film 7, a silicon oxide film is suitable for the masking film 5. Photo resists 6 are then coated upon the silicon oxide film 5 and delineated as shown in FIG. 4A through a photolithography process.

Figure 4A:
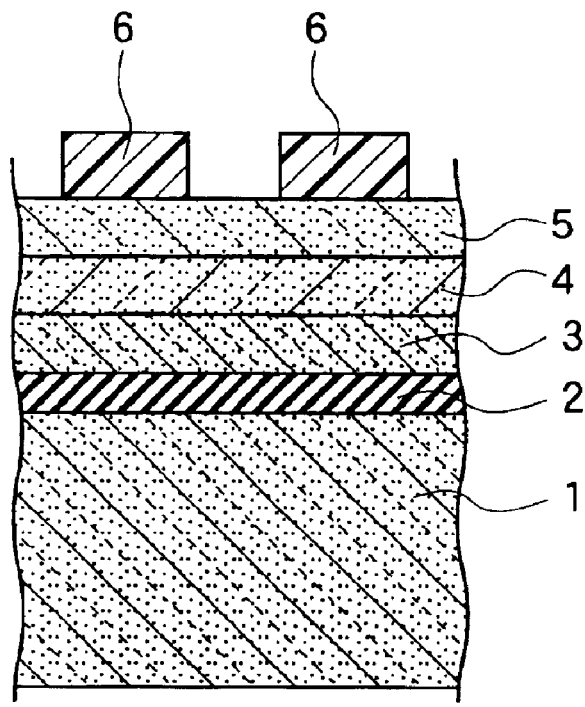
FIGS. 4A to 4E are cross sectional views for describing a fabrication method of the semiconductor memory according to the first embodiment of the present invention.
Figure 4B:
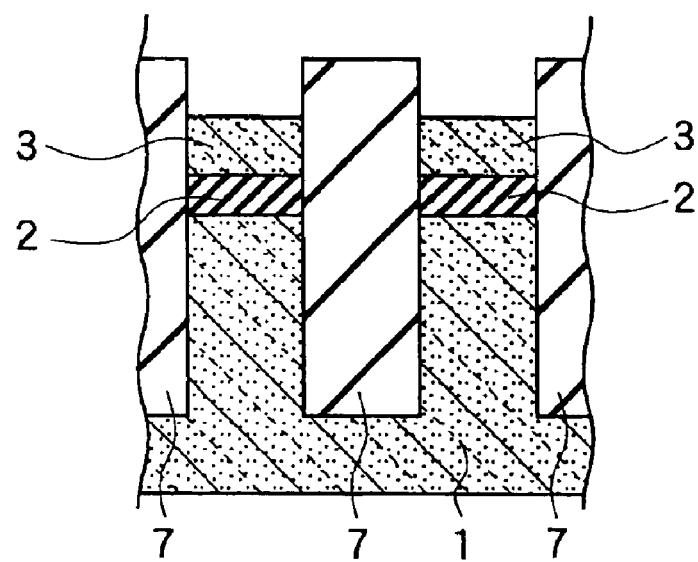

(b) Next, the masking film (silicon oxide film) 5 is selectively etched through reactive ion etching (RIE) using a photo resist 6 shown in FIG. 4A as an etching mask. The photo resist 6 is removed after the etching process is finished so as to etch the end point monitoring film (silicon nitride film) 4 using the silicon oxide film 5 as an etching mask. Furthermore, by etching successively the first conductive layer 3, the cell site gate insulator 2, and the upper portion of the semiconductor substrate 1, device isolation trenches running along the column-direction are formed periodically in the stacked structure of the end point monitoring film (silicon nitride film) 4, the first conductive layer 3, the cell site gate insulator 2, and the semiconductor substrate 1. Subsequently, the device isolation film 7 made from a silicon oxide film is blanket deposited with a thickness of 200 to 1500 nm, filling in the device isolation trenches. Furthermore, using the silicon nitride film (end point monitoring film) 4 as a stopper, the top surface of the device isolation film 7 is planarized through a first chemical mechanical polishing (CMP) so as to expose periodically a plurality of the top surfaces of the end point monitoring films (silicon nitride films) 4. The end point monitoring films (silicon nitride films) 4 are then removed so as to form rectangular grooves on the top surface of the first conductive layers 3 as shown in FIG. 4B, using hot phosphoric acid ($H_3PO_4$) solution, which is known to have a sufficient etching selectivity relative to the silicon oxide film 5. That is, a periodic structure implemented by first and second ridges, both running alternately along the column-direction is formed. Each of the first ridges is made of device isolation film 7 and each of the second ridges is made of one of protruding portions of a semiconductor substrate 1, a cell site gate insulator 2 on the protruding portion of the semiconductor substrate 1 and a first conductive layer 3 on the cell site gate insulator 2. As shown in FIG. 4B, the top surface of the second ridges (3, 2, 1) is lower than the top surface of the first ridges (7), each of the second ridges (3, 2, 1) is assigned to a corresponding cell column. Here, the method in which a stacked film of the silicon oxide film 5 and the silicon nitride film 4 is used for the etching mask, configured to form the device isolation trenches, is explained as an example. However, as long as film thickness and RIE conditions are appropriately designed, any material with a sufficient etching selectivity relative to silicon, including a single layer silicon nitride film, a single layer silicon oxide film, and other single layer or multi-layer films may be used as the etching mask.

Figure 4C:
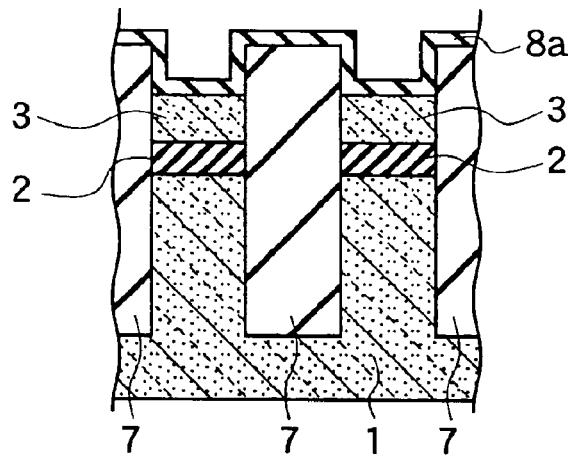

(c) Next, on the rectangular grooves on the top surface of the first conductive layers 3, formed after removing the silicon nitride film 4, as shown in FIG. 4B is blanket deposited an inter-electrode dielectric 8a, which is made from a material with a higher relative dielectric constant $\in_r$ than that of silicon oxide as shown in FIG. 4C. The inter-electrode dielectric 8a is blanket formed so as to cover the top surfaces of the first conductive layers 3, the top surfaces of the device isolation films 7 and steps, each of the steps is implemented by the level difference between the top surfaces of the first ridge (7) and second ridge (3, 2,1). The inter-electrode dielectric 8a has a thinner film thickness than the depth of the rectangular grooves, which is the level difference between the top surface of each device isolation film 7 and the top surface of each first conductive layer 3. The inter-electrode dielectric 8a should be deposited to a thickness of approximately 1 to 30 nm in terms of oxide film thickness using a method that allows excellent step coverage. The "material with a higher relative dielectric constant $\in_r$ than that of silicon oxide" is as described above; wherein a composite film of a single layer high dielectric constant insulating film, a silicon oxide film, and a high dielectric constant insulating film, or a multi-layer structure of various combinations of two layers or more of a high dielectric constant insulating film such as a silicon nitride film and a silicon oxide film may be employed.

Figure 4D:
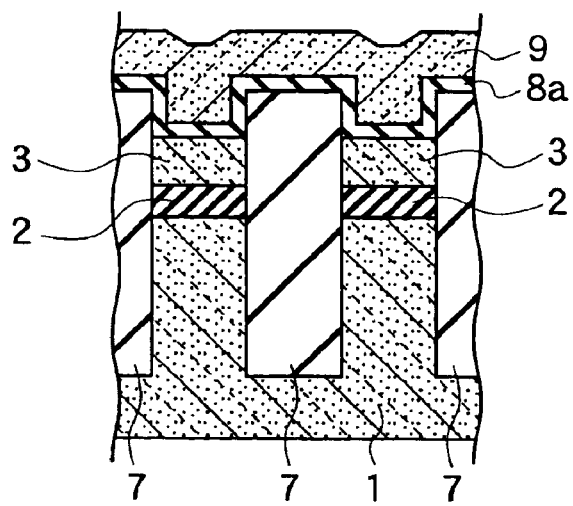
Figure 4E:
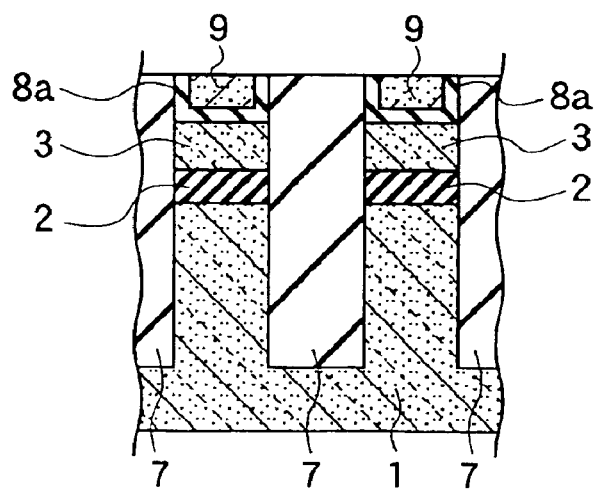

(d) An auxiliary conductive layer 9, which will be divided into a plurality of conductive layers, each serving as a part of the control gate electrode, is blanket deposited on the inter-electrode dielectric 8a as shown in FIG. 4D. However, the auxiliary conductive layer 9 is also formed for the purpose of protecting the top surface of the inter-electrode dielectric 8a during a second CMP process in the next step. The structural cross sectional view of FIG. 4E is then obtained by planarizing the top surface of the auxiliary conductive layer 9 using the top surface of the device isolation film 7 made of silicon oxide film or the like as polishing-stopper for the second CMP process so as to expose the top surfaces of the device isolation films 7 so that the auxiliary conductive layer 9 can be selectively embedded in grooves defined by the steps, the steps are implemented by the level difference between the top surfaces of the first ridge (7) and second ridge (3, 2, 1). In this second CMP process, the inter-electrode dielectric 8a on each of the device isolation films 7 is completely removed so that a single layer of the inter-electrode dielectric 8a is divided into a plurality of the inter-electrode dielectrics 8a disposed on corresponding first conductive layers 3. Simultaneously, a single layer of the auxiliary conductive layer 9 is divided into a plurality of the auxiliary conductive layers 9 disposed on corresponding inter-electrode dielectrics 8a.

(e) Subsequently, a polysilicon layer/tungsten silicide ($WSi_2$) layer is blanket deposited on the respective surfaces of the auxiliary conductive layers 9 and the device isolation films 7 so as to form a second conductive layer (control gate electrodes) 10. The thickness of the second conductive layer (control gate electrodes) 10 is set as approximately 10 to 200 nm, for example. Moreover, a masking film for RIE is deposited by CVD. And a resist film is coated on the masking film and is delineated so as to form an etching mask. Through RIE using resist film masks, the masking film, the second conductive layer (control gate electrodes) 10, the auxiliary conductive layers 9, the inter-electrode dielectrics 8, the first conductive layers (floating gate electrodes) 3, and the cell site gate insulators 2 are then successively and selectively etched to form a plurality of slits running parallel along the length of the word lines, which isolate memory cell transistors aligned in each of the memory columns. The shapes of the first conductive layers (floating gate electrodes) 3 and the second conductive layer (control gate electrodes) 10 are determined accordingly. That is, the shape of the each of the first conductive layers 3 is cut into a topology of a rectangular parallelepiped, and isolated rectangular parallelepipeds are arranged along the column and row-directions. The shape of the each of the second conductive layer 7 is cut into a ridge running along the row-direction.

(f) Next, silicon oxide films, which are called "electrode sidewall films", are formed by thermal oxidation on the exposed side surface of the silts running along the word line length, or along the row-direction. Then, source and drain diffusion regions for each memory cell transistor are formed in the semiconductor substrate 1 at the bottoms of the respective slits by ion implantation, and the serially connected memory cell transistors along the column-direction are formed, the channel length of each of the memory cell transistors are defined by the electrode sidewall film. In this way, the core, or the memory matrix cite of the semiconductor memory according to the first embodiment shown in FIGS. 2, 3A and 3B is completed. Actually, an interlayer insulating film is additionally formed through CVD so as to cover the entire surface, and it goes without saying that an interconnect layer or the like is then formed through a well-known method.

As explained above, according to the fabrication method of the semiconductor memory of the first embodiment, a semiconductor memory, which can suppresses the inter-cell coupling through the inter-electrode dielectric 8a to a minimum, is easily fabricated.

It should be noted that the semiconductor memory or the fabrication method thereof according to the first embodiment is not limited to the NAND flash memory shown in FIGS. 3A and 3B, and is naturally applicable to various nonvolatile memories, such as NOR flash memory, DINOR flash memory, AND flash memory, each of the nonvolatile memories encompasses one or more transistors having floating gates serving as the electric charge accumulating layers. One of the examples of the nonvolatile memories is AND flash memory, of which the equivalent circuit is given in FIG. 5.

Figure 5:
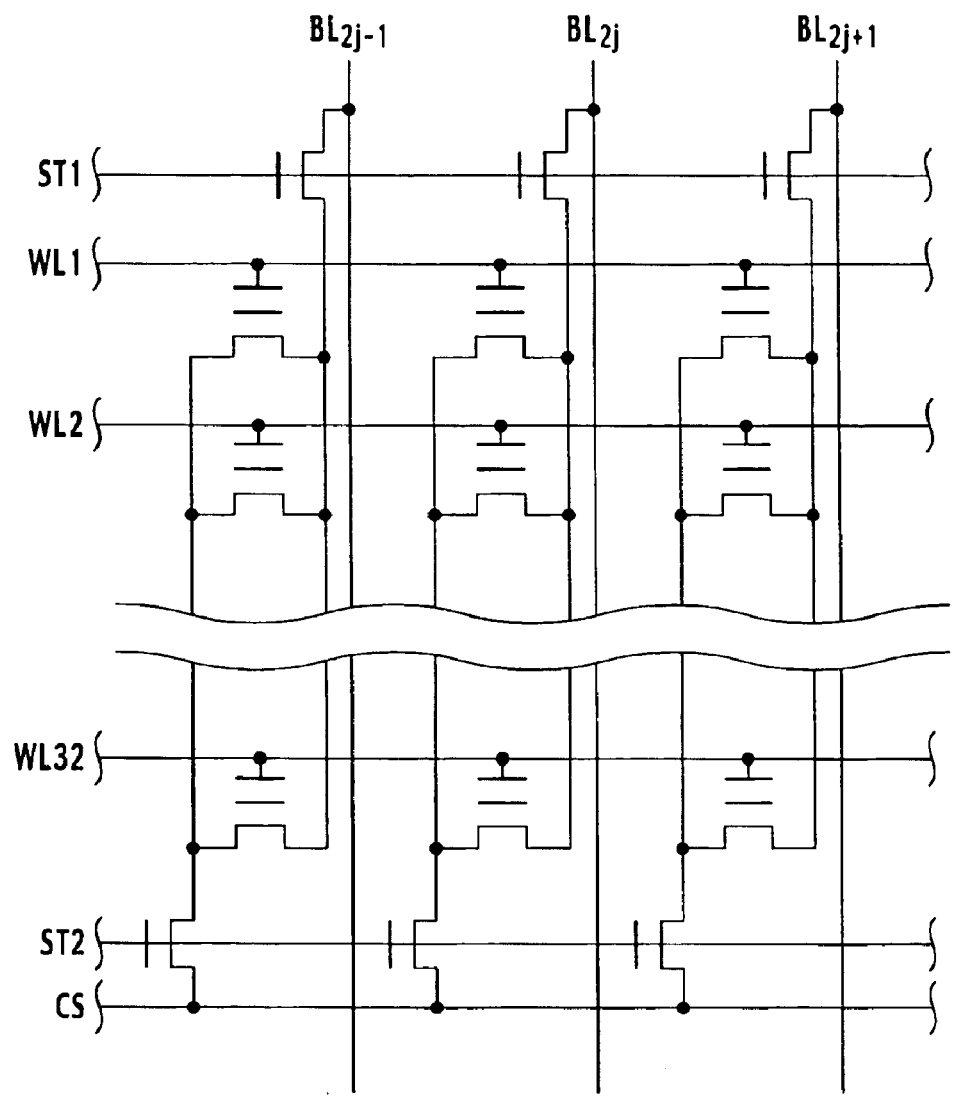
FIG. 5 is an equivalent circuit illustrating a modified example of the memory cell matrix of the semiconductor memory according to the first embodiment of the present invention.

In the AND flash memory, memory cell transistors sharing the same gate constitute the word lines WL1, WL2, . . . WL32 arranged along the horizontal direction. And memory cell transistors sharing the same drain electrode and same source electrode constitute bit lines $BL_{2j-1}$, $BL_{2j}$, $BL_{2j+1}$, . . . arranged along the vertical direction, orthogonal to these word lines WL1, WL2, . . . WL32. FIG. 5 illustrates the case where 32 memory cell transistors are arranged along the column-direction so as to implement each of the cell columns. Pair of select transistors, which select a group of memory cell transistors serially arranged in the cell column, are arranged at both ends of the cell column array. The plural cell columns are arranged in parallel, close to each other. Upper select gate line ST1 is connected to the respective gates of upper select transistors. Lower select gate line ST2 is connected to the respective gates of the lower select transistors. The drain electrode of the upper select transistors are connected to the corresponding bit lines $BL_{2j-1}$, $BL_{2j}$, $BL_{2j+1}$, . . . The source electrode of the upper select transistors are connected to the drain electrodes of memory cell transistors constituting the corresponding cell columns. The drain electrode of the lower select transistors are connected to the source electrodes of memory cell transistors constituting the corresponding cell columns, and the source electrode of the lower select transistors are connected to the common source line CS. As will be appreciated, the terms drain and source can be exchanged without modifying the structure itself. The structure and materials of the memory cell transistors are similar to the structure and materials already explained in the NAND flash memory, and overlapping or redundant description may be omitted in the AND flash memory.

(Second Embodiment)

Figure 6:
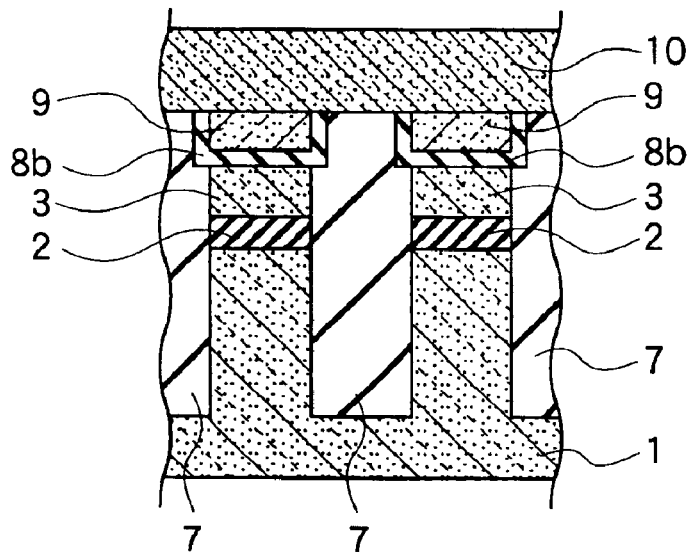
FIG. 6 is a schematic cross sectional view cut along the word line length showing a portion of a memory cell matrix of a semiconductor memory according to the second embodiment of the present invention.

FIG. 6 is a cross sectional view cut along the length of word lines WL1 through WL32 shown in FIG. 3B. In a semiconductor memory according to a second embodiment of the present invention, as shown in FIG. 6, parts of the sidewalls of each device isolation film 7 exposed to the spaces of the rectangular grooves, defined by the level difference between the top surface of each device isolation film 7 and the top surface of each first conductive layer 3 are encroached laterally so that the width of the rectangular grooves is increased. Inter-electrode dielectrics 8b are embedded in the encroached rectangular grooves formed on top surface of the first conductive layers so that the inter-electrode dielectrics 8b can contact both with the encroached sidewalls of the device isolating insulator layers 7 and the top surface of the first conductive layer 3.

Similarly to the semiconductor memory according to the first embodiment, the inter-electrode dielectrics 8b have a thinner film thickness than the level difference between the top surface of each device isolation film 7 and the top surface of each first conductive layer 3. Thus, rectangular spaces are defined in between the top surface of the inter-electrode dielectrics 8b and the bottom surface of the second device isolation film 10, and the auxiliary conductive layer 9 is embedded in each of these rectangular spaces. Otherwise, it basically has the same structure as the semiconductor memory according to the first embodiment, and thus overlapping or redundant description may be omitted.

With the semiconductor memory according to the second embodiment of the present invention, the structure of a memory cell transistor, which can suppress to a minimum the inter-cell coupling through the inter-electrode dielectrics 8b, can be achieved. Furthermore, with this configuration of the memory cell transistors, since there is no area loss occupied by the film thickness of the inter-electrode dielectrics 8b in the regions for forming the auxiliary conductive layers 9, an effective cross sectional area for the auxiliary conductive layers 9 can be ensured.

Figure 7A:
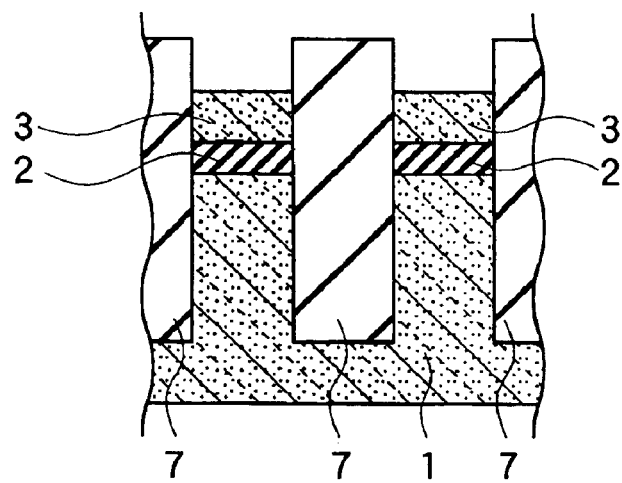
FIGS. 7A and 7B are cross sectional views for describing a fabrication method of the semiconductor memory according to the second embodiment of the present invention.
Figure 7B:
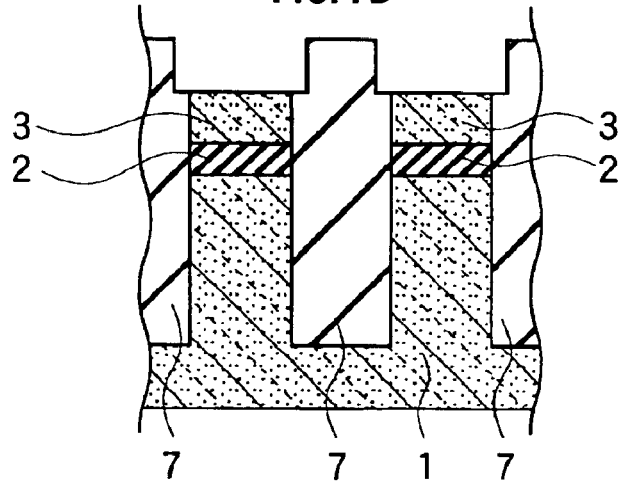

A fabrication method of the semiconductor memory according to the second embodiment is described referencing FIGS. 7A and 7B. The cross sectional view cut along the length of the bit lines $BL_{2j-1}$, $BL_{2j}$, $BL_{2j+1}$, . . . shown in FIG. 3B is omitted from FIGS. 7A and 7B. It should be noted that the fabrication method of the semiconductor memory given below is merely an example, and other various fabrication methods including modifications on this fabrication method may naturally be implemented.

(a) To begin with, the structural cross sectional view of FIG. 7A is obtained by the same sequence of steps as described in the fabrication method of the semiconductor memory according to the first embodiment. That is, a periodic structure implemented by first and second ridges, both running alternately along the column-direction is formed. Each of the first ridges is made of device isolation film 7 and each of the second ridges is made of one of protruding portions of a semiconductor substrate 1, a cell site gate insulator 2 on the protruding portion of the semiconductor substrate 1 and a first conductive layer 3 on the cell site gate insulator 2. As shown in FIG. 7A, the top surface of the second ridges (3, 2, 1) is lower than the top surface of the first ridges (7), each of the second ridges (3, 2, 1) is assigned to a corresponding cell column. However, with the fabrication method of the semiconductor memory according to the second embodiment, once the silicon nitride film 4 shown in the cross sectional view of FIG. 4A has been removed, isotropic etching of the device isolation films 7 is performed so as to widen the width of the rectangular grooves formed by removing the silicon nitride film 4, as shown in FIG. 7B. The device isolation films 7 are made from a silicon oxide film in this case.

(b) The inter-electrode dielectric 8b, which is made of a material with a higher relative dielectric constant $\in_r$ than that of silicon oxide, is deposited both on the sidewalls and bottom surface of the widened rectangular grooves. The inter-electrode dielectric 8b is deposited to a thickness of approximately 1 to 30 nm in terms of oxide film thickness using a method facilitating excellent step coverage. The "material with a higher relative dielectric constant $\in_r$ than that of silicon oxide" is as described in the first embodiment, where a single layer high dielectric constant insulating film or various multi-layer structures such as a composite film of a silicon oxide film and a high dielectric constant insulating film and the like may be employed. As shown in FIG. 6, the film thickness of each inter-electrode dielectric 8b is selected to be thinner than the depth of the widened rectangular groove shown in FIG. 7B. As a result, the shape of each deposited inter-electrode dielectric 8b imitates the rectangular groove shown in FIG. 7B, forming a new rectangular groove similar to that in FIG. 7B.

(c) Subsequently, an auxiliary conductive layer 9 is blanket formed on the inter-electrode dielectrics 8b as well as on the top of the device isolation films 7. The auxiliary conductive layer 9 is blanket deposited up to a thickness such that the auxiliary conductive layer 9 can fill in the rectangular grooves defined by the inner surface of the inter-electrode dielectrics 8b. It should be noted that the auxiliary conductive layer 9 serves as a protection film configured to protect the top surface of the inter-electrode dielectrics 8b during CMP in the next step.

(d) Next, the top surface of the auxiliary conductive layers 9 are planarized through CMP using the device isolation films 7 as stoppers. In this CMP process, portions of the auxiliary conductive layers 9 and the inter-electrode dielectrics 8b disposed on top of the device isolation films 7 are completely removed and divided into a plurality of the auxiliary conductive layers 9 and the inter-electrode dielectrics 8b, respectively. The plurality of the auxiliary conductive layers 9 and the inter-electrode dielectrics 8b are respectively assigned by corresponding memory cell columns. Each of the auxiliary conductive layers 9 serves as a part of the control gate electrode in the memory cell transistor of the semiconductor memory.

(e) Next, a second conductive layer (control gate electrodes) 10 is blanket deposited on the respective surfaces of the auxiliary conductive layers 9 and the device isolation films 7 up to a thickness approximately 10 to 200 nm. Moreover, a masking film for RIE is deposited. Through RIE with photolithography, the masking film, the second conductive layer (control gate electrodes) 10, the auxiliary conductive layers 9, the inter-electrode dielectrics 8, the first conductive layers (floating gate electrodes) 3, and the cell site gate insulators 2 are then successively and selectively etched to form a plurality of slits running along the length of the word lines, which isolate memory cell transistors aligned in each of the memory columns. The shape of the each of the first conductive layers 3 is cut into a topology of a rectangular parallelepiped, and isolated rectangular parallelepipeds are arranged along the column and row-directions. The shape of the each of the second conductive layer 7 is cut into a ridge running along the row-direction.

(f) Then, source and drain diffusion regions for each memory cell transistor are formed in the semiconductor substrate 1 at the bottoms of the respective slits by ion implantation, and the serially connected memory cell transistors along the column-direction are formed. Here, the electrode sidewall film may define the channel length of each of the memory cell transistors. In this way, the core, or the memory matrix cite of the semiconductor memory according to the second embodiment shown in FIG. 6 is completed.

With the fabrication method of the semiconductor memory according to the second embodiment of the present invention, a semiconductor memory, which can suppresses the inter-cell coupling through the inter-electrode dielectrics 8b to a minimum, can be easily provided. In addition, compared to the fabrication method of the semiconductor memory according to the first embodiment, area loss in the auxiliary conductive layer 9 may be controlled to a minimum.

(Third Embodiment)

Figure 8:
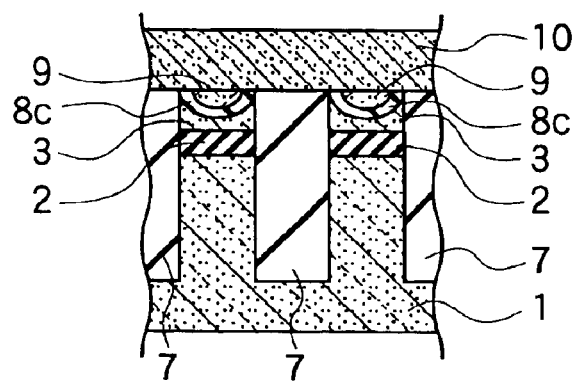
FIG. 8 is a schematic cross sectional view cut along the word line length showing a portion of a memory cell matrix of a semiconductor memory according to the third embodiment of the present invention.

FIG. 8 is a cross sectional view cut along the length of word lines WL1 through WL32 shown in FIG. 3B. A semiconductor memory according to a third embodiment of the present invention, as shown in FIG. 8, differs from the semiconductor memory according to the first and second embodiments in that each of the top shapes of the first conductive layers 3 makes a gradual curved surface so as to form a semi-cylindrical concave. By the topology of the semi-cylindrical concave, the height of the first conductive layer 3 at both edges of the curved surface, near the sidewalls of the device isolation films 7, is higher than the height of the central portion of the first conductive layer 3.

An inter-electrode dielectric 8c is then embedded in the semi-cylindrical concaves on top surface of the first conductive layers 3 such as to make contact with the top surface of the first conductive layers 3 that make this concave topology. Similarly to the semiconductor memory according to the first and second embodiments, each inter-electrode dielectric 8c has a thinner film thickness than the level difference between the top surface of each device isolation film 7 and the top surface of each first conductive layer 3. Thus, semi-cylindrical concaves are formed in between the top surface of each inter-electrode dielectric 8c and the bottom surface of the second device isolation film 10, and the auxiliary conductive layer 9 is embedded in each of these semi-cylindrical concaves. Otherwise, it basically has the same structure as the semiconductor memory according to the first and second embodiments, and thus overlapping or redundant description may be omitted.

According to the structure of the memory cell transistor of the semiconductor memory according to the third embodiment of the present invention, the inter-cell coupling through the inter-electrode dielectric 8c can be controlled to a minimum. Furthermore, with this configuration of the memory cell transistors, since the top surface of the auxiliary conductive layers 9 is given a curved surface, each inter-electrode dielectric 8c may be prevented from forming the process-oriented topology, in which the film thickness becomes thick near the edges of the trenches, and as with the semiconductor memory according to the second embodiment, there is no area loss occupied by the film thickness of the inter-electrode dielectric 8c in the regions for forming the auxiliary conductive layers 9. Thus, ensuring an effective surface area for the auxiliary conductive layers 9 is possible so as to achieve a higher storage capacitance.

Figure 9A:
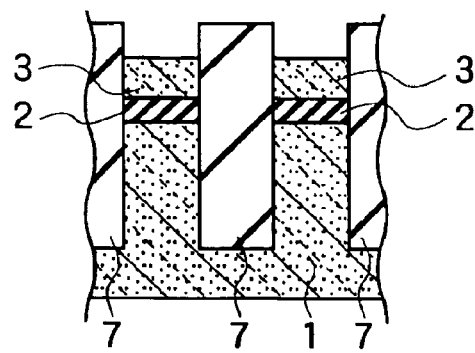
FIGS. 9A to 9C are cross sectional views for describing a fabrication method of the semiconductor memory according to the third embodiment of the present invention.
Figure 9B:
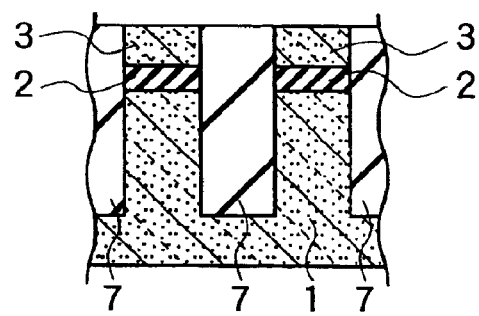
Figure 9C:
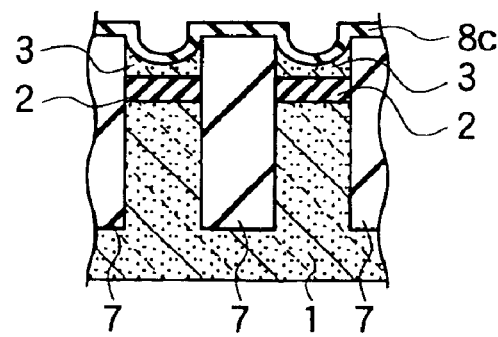

A fabrication method of the semiconductor memory according to the third embodiment is described referencing FIGS. 9A to 9C. The cross sectional view cut along the length of the bit lines $BL_{2j-1}$, $BL_{2j}$, $BL_{2j+1}$, . . . shown in FIG. 3B is omitted from FIGS. 9A to 9C. It should be noted that the fabrication method of the semiconductor memory given below is merely an example, and other various fabrication methods including modifications on this fabrication method may naturally be implemented.

(a) To begin with, the structural cross sectional view of FIG. 9A is obtained by the same sequence of steps as described in the fabrication method of the semiconductor memory according to the first embodiment. That is, a periodic structure implemented by first and second ridges, both running alternately along the column-direction is formed. Each of the first ridges is made of device isolation film 7 and each of the second ridges is made of one of protruding portions of a semiconductor substrate 1, a cell site gate insulator 2 on the protruding portion of the semiconductor substrate 1 and a first conductive layer 3 on the cell site gate insulator 2. As shown in FIG. 9A, the top surface of the second ridges (3, 2, 1) is lower than the top surface of the first ridges (7), each of the second ridges (3, 2, 1) is assigned to a corresponding cell column. Next, the structural cross sectional view of FIG. 9B is obtained by planarizing by a first CMP. The first conductive layers 3 are used as stoppers to planarize in this first CMP process.

(b) Subsequently, by the second CMP using extremely flexible pads, as shown in FIG. 9C, at the top surface of each of the first conductive layer 3 semi-cylindrical concaves are formed. That is, the first conductive layers 3 disposed in between the device isolation films 7 are depressed respectively into curved shapes such that the center thereof become the deepest portions. In other words, the top surface of each of the first conductive layers 3 exposed by the first CMP is further removed by the second CMP such that a gradual curved surface is formed at the top surface of each first conductive layer 3, in which the height near the sidewalls of the device isolation films 7 is higher than the height of the central portion of each first conductive layer 3. The inter-electrode dielectrics 8c, which are made from a material with a higher relative dielectric constant $\in_r$ than that of silicon oxide, are then deposited on the inner surfaces of the semi-cylindrical concave as shown in FIG. 9C. The deposition onto the curved surface of each inter-electrode dielectric 8c uses a method that allows excellent step coverage so as to control the thickness of that deposition to a depth of approximately 1 to 30 nm in terms of oxide film thickness. The "material with a higher relative dielectric constant $\in_r$ than that of silicon oxide" is as described with the first embodiment.

(c) Subsequently, an auxiliary conductive layer 9 is blanket formed on the inter-electrode dielectrics 8b as well as on the top of the device isolation films 7. The auxiliary conductive layer 9 is blanket deposited up to a thickness such that the auxiliary conductive layer 9 can fill in the semi-cylindrical concaves defined by the inner surface of the inter-electrode dielectrics 8b. It should be noted that the auxiliary conductive layer 9 serves as a protection film configured to protect the top surface of the inter-electrode dielectrics 8b during third CMP in the next step.

(d) Next, the top surface of the auxiliary conductive layers 9 are planarized through third CMP using the device isolation films 7 as stoppers. In this third CMP process, portions of the auxiliary conductive layers 9 and the inter-electrode dielectrics 8b disposed on top of the device isolation films 7 are completely removed and divided into a plurality of the auxiliary conductive layers 9 and the inter-electrode dielectrics 8b, respectively.

(e) Next, a second conductive layer 10 is blanket deposited on the respective surfaces of the auxiliary conductive layers 9 and the device isolation films 7 up to a thickness approximately 10 to 200 nm. Moreover, a masking film for RIE is deposited. Through RIE with photolithography, the masking film, the second conductive layer 10, the auxiliary conductive layers 9, the inter-electrode dielectrics 8, the first conductive layers 3, and the cell site gate insulators 2 are then successively and selectively etched to form a plurality of slits running along the length of the word lines, which isolate memory cell transistors aligned in each of the memory columns. The shape of the each of the first conductive layers 3 is cut into a topology of a rectangular parallelepiped, and isolated rectangular parallelepipeds are arranged along the column and row-directions. The shape of the each of the second conductive layer 7 is cut into a ridge running along the row-direction.

(f) Then, source and drain diffusion regions for each memory cell transistor are formed in the semiconductor substrate 1 at the bottoms of the respective slits by ion implantation, and the serially connected memory cell transistors along the column-direction are formed. Here, the electrode sidewall film may define the channel length of each of the memory cell transistors. In this way, the memory matrix cite of the semiconductor memory according to the third embodiment shown in FIG. 8 is completed.

According to the fabrication method of the semiconductor memory according to the third embodiment of the present invention, since the inter-electrode dielectrics 8c on the device isolation films 7 are completely removed by the third CMP, the inter-cell coupling through the inter-electrode dielectrics 8b may be controlled to a minimum. Furthermore, by giving a curved surface to the top surface of the auxiliary conductive layers 9, the inter-electrode dielectrics 8c may be prevented from becoming thick near the edges of the rectangular trenches, into which the auxiliary conductive layers 9 are embedded, and the area loss of the auxiliary conductive layers 9 may be controlled.

(Fourth Embodiment)

Figure 10:
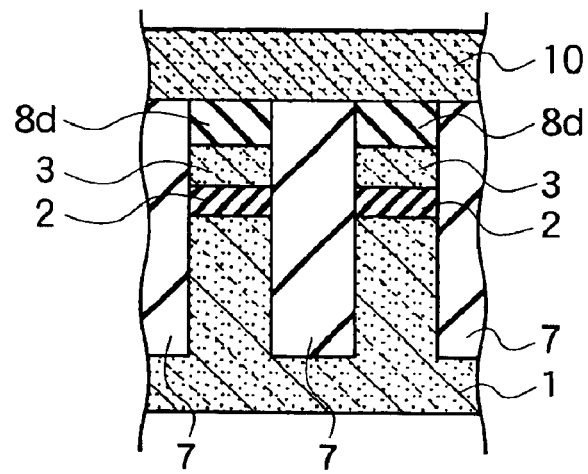
FIG. 10 is a schematic cross sectional view cut along the word line length showing a portion of a memory cell matrix of a semiconductor memory according to the third embodiment of the present invention.

A semiconductor memory according to a fourth embodiment of the present invention, as shown in FIG. 10, differs from the semiconductor memory according to the first to third embodiments in that the shape of inter-electrode dielectrics 8d is a flat parallel plate. Differs to the semiconductor memory according to the first through third embodiments, the inter-electrode dielectrics 8d have the same film thickness as the level difference between the top surface of each device isolation film 7 and the top surface of each first conductive layer 3. Thus, differing from the semiconductor memory according to the first through third embodiments, spaces are not formed in between the top surface of the inter-electrode dielectrics 8d and the bottom surface of the second device isolation film 10, and the auxiliary conductive layers 9 embedded in these spaces do not exist. Otherwise, it basically has the same structure as the semiconductor memory according to the first through third embodiments, and thus overlapping or redundant description may be omitted.

According to the semiconductor memory according to the fourth embodiment of the present invention, a structure of a memory transistor where the surface area of the top surface of the inter-electrode dielectric 8d completely coincides with the surface area of the bottom surface of the inter-electrode dielectric 8d can be achieved, and the inter-cell coupling through each inter-electrode dielectric 8d can be controlled. The surface area of the bottom surface is defined at the interface between the inter-electrode dielectric 8d and the first conductive layers 3. Furthermore, with the semiconductor memory according to the fourth embodiment of the present invention, since the memory cell transistor has no area loss portion occupied by the film thickness of each inter-electrode dielectric 8d in the region for forming each auxiliary conductive layer 9, as with the semiconductor memory according to the first embodiment, the surface area loss for the memory cell transistor can be controlled.

Figure 11A:
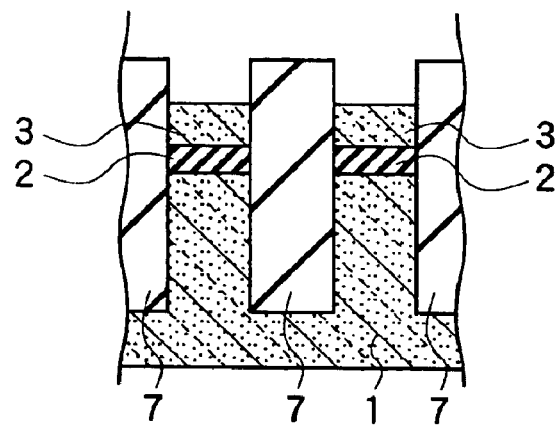
FIGS. 11A and 11B are schematic cross sectional views for describing a fabrication method of a semiconductor memory according to the fourth embodiment of the present invention.
Figure 11B:
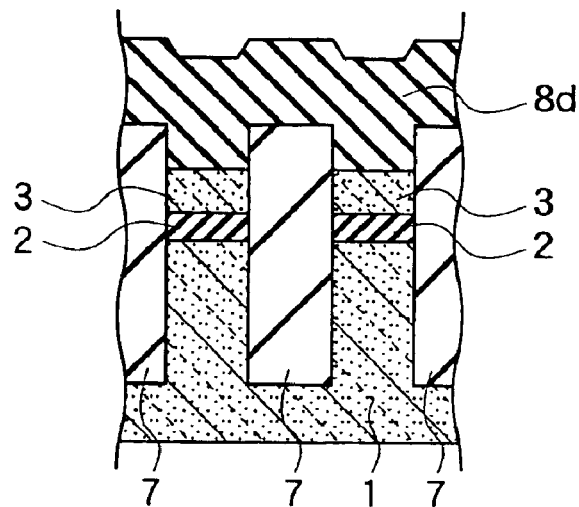

A fabrication method of a semiconductor memory according to the fourth embodiment of the present invention is described referencing FIGS. 11A and 11B. It should be noted that the fabrication method of the semiconductor memory given below is merely an example, and other various fabrication methods including modifications on this fabrication method may naturally be implemented.

(a) To begin with, the structural cross sectional view of FIG. 11A is obtained by the same sequence of steps as described in the fabrication method of the semiconductor memory according to the first embodiment. That is, a periodic structure implemented by first and second ridges, both running alternately along the column-direction is formed. Each of the first ridges is made of device isolation film 7 and each of the second ridges is made of one of protruding portions of a semiconductor substrate 1, a cell site gate insulator 2 on the protruding portion of the semiconductor substrate 1 and a first conductive layer 3 on the cell site gate insulator 2. As shown in FIG. 11A, the top surface of the second ridges (3, 2, 1) is lower than the top surface of the first ridges (7), each of the second ridges (3, 2, 1) is assigned to a corresponding cell column. Subsequently, as shown in FIG. 11B, the inter-electrode dielectrics 8d are formed on the rectangular trenches with a film thickness completely filling in the level difference using a method that allows excellent step coverage.

(b) Next, the inter-electrode dielectrics 8d are planarized through CMP using the device isolation films 7 as stoppers. In this CMP process, portions of the inter-electrode dielectrics 8b disposed on top of the device isolation films 7 are completely removed and divided into a plurality of the inter-electrode dielectrics 8b. The plurality of the inter-electrode dielectrics 8b are respectively assigned by corresponding memory cell columns.

(c) Next, a second conductive layer 10 is blanket deposited on the respective surfaces of the inter-electrode dielectrics 8b and the device isolation films 7 up to a thickness approximately 10 to 200 nm. Moreover, a masking film for RIE is deposited. Through RIE with photolithography, the masking film, the second conductive layer 10, the inter-electrode dielectrics 8, the first conductive layers 3, and the cell site gate insulators 2 are then successively and selectively etched to form a plurality of slits running along the length of the word lines, which isolate memory cell transistors aligned in each of the memory columns. The shape of the each of the first conductive layers 3 is cut into a topology of a rectangular parallelepiped, and isolated rectangular parallelepipeds are arranged along the column and row-directions. The shape of the each of the second conductive layer 7 is cut into a ridge running along the row-direction.

(d) Then, source and drain diffusion regions for each memory cell transistor are formed in the semiconductor substrate 1 at the bottoms of the respective slits by ion implantation, and the serially connected memory cell transistors along the column-direction are formed. Here, the electrode sidewall film may define the channel length of each of the memory cell transistors. In this way, the core, or the memory matrix cite of the semiconductor memory according to the fourth embodiment shown in FIG. 10 is completed.

With the semiconductor memory according to the fourth embodiment of the present invention, implementing a flat parallel plate structure where the top and bottom surfaces of each inter-electrode dielectric 8d completely coincide is possible, and the surface area loss of the semiconductor memory can be controlled since the inter-cell coupling through the inter-electrode dielectrics 8d can be controlled, and the inter-electrode dielectrics 8c may be prevented from becoming thick near the edges of the trenches, as with the fabrication method of the semiconductor memory according to the first embodiment.

(Other Embodiments)

Various modifications will become possible for those skilled in the art after receiving the teaching of the present disclosure without departing from the scope thereof.

The inter-electrode dielectrics 8a, 8b, 8c and 8d on the top surface of the device isolation films 7 are removed by CMP as described in the first through fourth embodiments. However, as described below, if each inter-electrode dielectrics 8d is embedded through selective CVD in the concaves, rectangular grooves, or the space defined by the level difference between the top surface of the device isolation film 7 and the top surface of the first conductive layer 3 as shown in FIG. 11A, for example, CMP is unnecessary.

A fabrication method of a semiconductor memory according to another embodiment of the present invention is accomplished as follows:

(a) Here, the description starts from the stage shown in FIG. 11A. That is, a polysilicon layer (first conductive layers) 3, which is exposed to the rectangular grooves or the level difference portions of the top surfaces of the device isolation films 7 and the top surfaces of the first conductive layers 3 shown in FIG. 11A, is rinsed with a hydrochloric acid (HCl) or a dilute hydrofluoric acid (HF) solution, and a natural oxide film of a thickness less than 1 nm is formed on the top surface of the first conductive layers 3.

(b) Next, the semiconductor substrate 1 is introduced into a low-pressure CVD (LPCVD) furnace and exposed under a hydrogen ambient of 1 kPa at 850° C. so as to remove the natural oxide film from the top surface of the first conductive layer (polysilicon layer) 3. Further, the internal condition of the LPCVD furnace is changed to 700° C. and 50 Pa while the semiconductor substrate 1 is still therewithin, tetrachlorosilane (SiCl$_4$) gas and ammonia (NH$_3$) gas are introduced, and then 2 nm-thick CVD silicon nitride film is formed as the inter-electrode dielectric 8d on the top surface of the first conductive layer (polysilicon layer) 3. At this time, a CVD silicon nitride film is not deposited on the top surface of the device isolation films 7. This is considered emanating from the surface reaction of an adsorbed species that are generated through tetrachlorosilane (SiCl$_4$) gas decomposition. In other words, this is because the time (incubation period) necessary before starting deposition of the Si$_3$N$_4$ film 8d is longer on the surface of silicon oxide film than on the surface of silicon.

It should be noted that hydrogen annealing for removing the natural oxide film is preferably performed at a reduced pressure. This is because when the pressure is high, a high temperature of 900° C. or greater is necessary in order to sufficiently remove the natural oxide film, and with high temperature hydrogen annealing, the quality of the tunnel oxide film deteriorates, thereby reducing the reliability of the memory cell.

In addition, in order to increase the difference in incubation time on the surface of silicon and on the surface of silicon oxide film, a selective deposition condition for the first inter-electrode dielectric (Si$_3$N$_4$ film) 8d is preferably at a temperature under 700° C. The lower the temperature, the better; however, 500° C. or higher is preferred in view of surface reaction energy. Growth speed becomes extremely slow under 500° C., and is thus impractical.

In order to increase the difference in incubation time on the surface of silicon and on the surface of silicon oxide film utilizing surface reaction, the silicon source is preferably made of a silicon halide, more preferably a chloride compound. As the silicon chloride compound, trichlorosilane (SiHCl$_3$) is preferred over dichlorosilane (SiH$_2$Cl$_2$), and tetrachlorosilane is preferred over trichlorosilane.

Furthermore, it is omitted from the drawings, however, by making the film thickness of the inter-electrode dielectrics 8a, 8b and 8c uneven at the top surface of each first conductive layer 3, the same effectiveness as with the semiconductor memory according to the third embodiment shown in FIG. 8 can be obtained. The uneven thickness topology is such that the film thickness of the inter-electrode dielectrics 8a, 8b and 8c at the vicinity of the sidewalls of the device isolation films 7 is thicker than that of the central portion.

In addition, for example, needless to say, even by selectively depositing the inter-electrode dielectrics 8a and 8c with a thinner film thickness than the level difference between the top surface of each device isolation film 7 and the top surface of each first conductive layer 3, the same effectiveness can be obtained as with each of the semiconductor memories according to the first embodiment shown in FIG. 2 or the third embodiment shown in FIG. 8.

Figure 12:
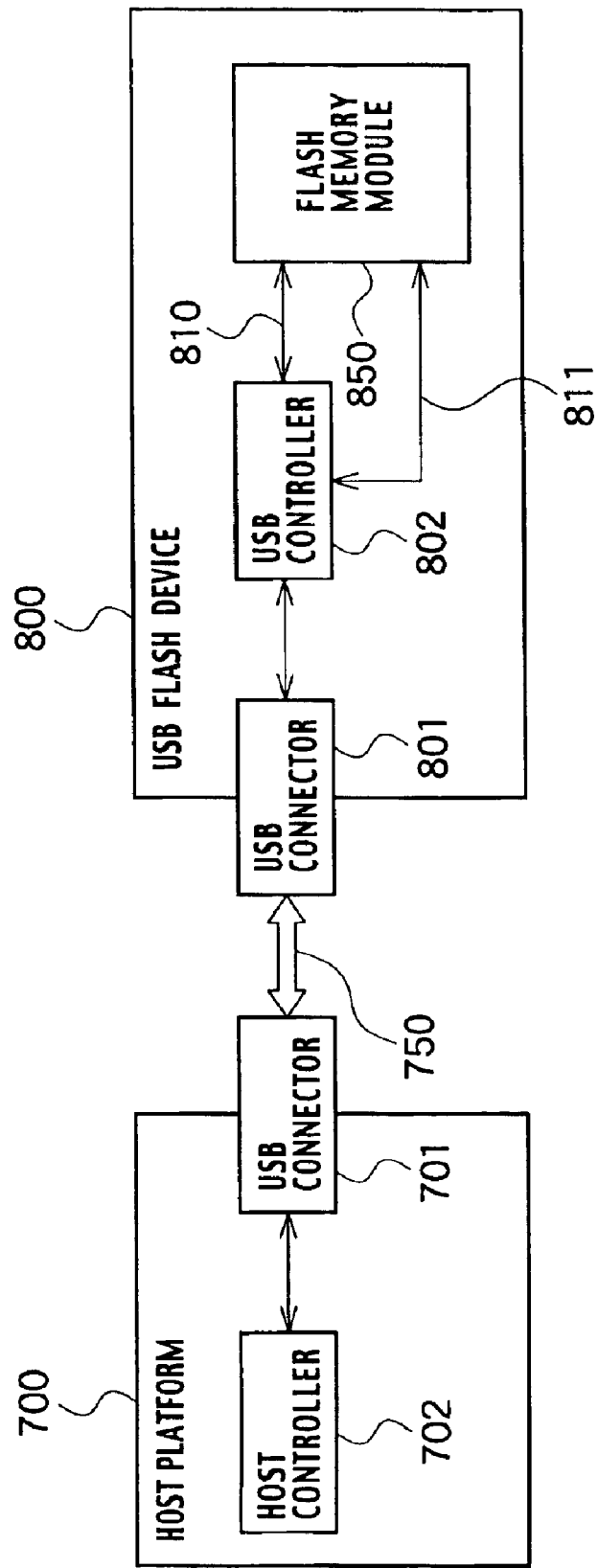
FIG. 12 is a schematic block diagram showing a structure in the case where the nonvolatile semiconductor memory according to the first to the fourth embodiment of the present invention is applied to a flash memory system.

Furthermore, the nonvolatile semiconductor memory system according to the first to fourth embodiments of the present invention is applicable to a universal serial bus (referred to as "USB" hereafter) flash device 800 as shown in FIG. 12. The flash memory system shown in FIG. 12 is implemented by a host platform 700 and the USB flash device 800. The host platform 700 is connected to the USB flash device 800 via a USB cable 750. The host platform 700 is connected to the USB cable 750 via a USB connector 701, and the USB flash device 800 is connected to the USB cable 750 via a USB connector 801. The host platform 700 has a USB host controller 702, which controls packet transmission through a USB bus. The USB flash device 800 encompasses a USB controller 802, which controls other elements in the USB flash device 800 as well as controls the interface with the USB bus for the USB flash device 800; the USB connector 801; and a flash memory module 850, which is implemented by at least one semiconductor memory described in the first to fourth embodiments of the present invention.

When the USB flash device 800 is connected to the host platform 700, standard USB enumeration processing begins. In this processing, the host platform 700 recognizes the USB flash device 800, selects a mode for transmission therewith, and performs reception/transmission of data from/to the USB flash device 800 via a FIFO buffer called an end point, which stores transfer data. The host platform 700 recognizes changes in the physical and electrical states such as removal/attachment of the USB flash device 800 via another end point, and receives any existing to-be-received packets. The host platform 700 requests services from the USB flash device 800 by sending a request packet to the USB host controller 702. The USB host controller 702 transmits the packet to the USB cable 750. If the USB flash device 800 is the unit with the end point that has received this request packet, the USB controller 802 accepts this request.

Next, the USB controller 802 performs various operations such as read-out, write-in or erasure of data from or to the flash memory module 850. In addition, it supports basic USB functions such as acquiring a USB address and the like. The USB controller 802 controls the flash memory module 850 via either a control line 810, which is used to control output from the flash memory module 850, or, for example, other various signals such as /CE, a read-out signal or a write-in signal. Furthermore, the flash memory module 850 is also connected to the USB controller 802 via an address data bus 811. The address data bus 811 transfers read-out, write-in or erasure commands for the flash memory module 850, and the address and data for the flash memory module 850.

In order to notify the host platform 700 of the result and status of the various operations requested by the host platform 700, the USB flash device 800 transmits a status packet using a status end point (end point 0). In this processing, the host platform 700 checks (polls) for the existence of a status packet, and the USB flash device 800 returns an empty packet or a status packet in the case where there is no packet for a new status message. As described thus far, applying the flash memory module 850, which is implemented by at least one semiconductor memory described in the first to fourth embodiments of the present invention, allows implementation of various functions of the USB flash unit. Directly connecting the connectors is also possible, by omitting the USB cable described above.

Thus, the present invention of course encompasses various embodiments and modifications and the like which are not detailed above. Therefore, the scope of the present invention will be defined in the following claims.

What is claimed is:

1. A semiconductor memory comprising a memory cell matrix including a plurality of cell columns arranged along a row-direction, each of cell columns is implemented by a plurality of memory cell transistors serially arranged along a column-direction, the memory cell matrix comprising:

a plurality of device isolation films running along the column-direction, arranged alternatively between the cell columns;

a plurality of first conductive layers having top surfaces lower than a level of top surfaces of the device isolation films, arranged along the row and column-directions, a group of the first conductive layers arranged along the column-direction is assigned to a corresponding cell column, adjacent groups of the first conductive layers assigned to adjacent cell columns are isolated from each other by the device isolation film disposed between the adjacent groups;

a plurality of inter-electrode dielectrics arranged selectively and respectively on corresponding first conductive layers, the inter-electrode dielectric has a dielectric constant larger than that of silicon oxide; and a plurality of second conductive layers running along the row-direction, each of the second conductive layers arranged on the inter-electrode dielectric and the device isolation films so that the second conductive layer can be shared by the memory cell transistors arranged along the row-direction belonging to different cell columns.

2. The semiconductor memory of claim 1, wherein each of the inter-electrode dielectrics is embedded at least a portion of a space defined by a top surface corresponding to a level of the top surfaces of the device isolation films and a bottom surface corresponding to a level of the top surfaces of the first conductive layers.

3. The semiconductor memory of claim 2, wherein a thickness of the inter-electrode dielectrics is thinner than a difference between the level of the top surfaces of the device isolation films and the level of the top surfaces of the first conductive layers, and each of a bottom surfaces of the inter-electrode dielectrics contacts with side surfaces of the device isolation films and a top surface of the corresponding first conductive layer.

4. The semiconductor memory of claim 3, further comprising auxiliary conductive layers filled respectively in isolated spaces, each of which are defined by a bottom surface of a corresponding second conductive layer and a top surface of the corresponding inter-electrode dielectric.

5. The semiconductor memory of claim 3, wherein the thickness of each of the inter-electrode dielectrics at both edges near the device isolation film is thicker than that at central portion.

6. The semiconductor memory of claim 3, wherein each of the top surfaces of the first conductive layers manifests a curved surface such that both edges of the curved surface are higher than a level of a central portion of the curved surface.

7. The semiconductor memory of claim 2, wherein the space, in which the inter-electrode dielectrics is embedded, manifests a topology of a rectangular groove, whose sidewalls encroach laterally corresponding side walls of adjacent device isolation films so as to widen a width of the rectangular groove.

8. The semiconductor memory of claim 1, wherein each of the inter-electrode dielectrics is a single layer film selected from a group consisting of an silicon oxide film, a silicon nitride film, an aluminum oxide film, a hafnium oxide film and a zirconium oxide film or a composite film including at least one of the single layer film.

9. A method for manufacturing a semiconductor memory comprising a memory cell matrix including a plurality of cell columns arranged along a row-direction, each of cell columns is implemented by a plurality of memory cell transistors serially arranged along a column-direction, the method comprising:

forming a periodic structure implemented by first and second ridges, both running alternately along the column-direction, each of the first ridges is made of device isolation film and each of the second ridges is made of one of protruding portions of a semiconductor substrate, a cell site gate insulator on the protruding portion of the semiconductor substrate and a first conductive layer on the cell site gate insulator, a top surface of the second ridges is lower than a top surface of the first ridges, each of the second ridges is assigned to a corresponding cell column;

forming a plurality of inter-electrode dielectrics on corresponding first conductive layers such that adjacent inter-electrode dielectrics are isolated by one of the first ridges, the inter-electrode dielectric has a dielectric constant larger than that of silicon oxide; and forming a plurality of second conductive layers running along the row-direction, each of the second conductive layers arranged on the inter-electrode dielectric and the device isolation films so that the second conductive layer can be shared by the memory cell transistors arranged along the row-direction belonging to different cell columns.

10. The method of claim 9, wherein the forming inter-electrode dielectrics comprises:

blanket forming the inter-electrode dielectric so as to cover top surfaces of the first conductive layers, top surfaces of the device isolation films and steps defined by the top surfaces of the first and second ridges; and planarizing a top surface of the inter-electrode dielectric so as to expose the top surfaces of the device isolation films.

11. The method of claim 9, wherein the forming inter-electrode dielectrics comprises:

blanket forming the inter-electrode dielectric so as to cover top surfaces of the first conductive layers, top surfaces of the device isolation films and steps defined by the top surfaces of the first and second ridges;

blanket forming an auxiliary conductive layer on the inter-electrode dielectric; and planarizing a top surface of a stacked layer of the auxiliary conductive layer and the inter-electrode dielectric so as to expose top surfaces of the device isolation films so that the auxiliary conductive layer can be selectively embedded in grooves defined by the steps.

12. The method of claim 11, after forming the periodic structure, further comprising:

etching sidewalls of device isolation films exposed at spaces implemented by the steps so as to widen a width of the spaces, before blanket forming the inter-electrode dielectric.

13. The method of claim 9, wherein the forming inter-electrode dielectrics comprises:

removing natural oxide films formed on surfaces of the first conductive layers by gas etching in a CVD furnace; and forming selectively the inter-electrode dielectrics on a top surface of the first conductive layers in the CVD furnace, keeping a natural oxide removed surface of the first conductive layers airtight.

14. The method of claim 13, wherein the forming selectively the inter-electrode dielectrics is executed at substrate temperatures between 500° C. to 700° C.

15. The method of claim 13, wherein the forming selectively the inter-electrode dielectrics is executed by CVD process using silicon halide as a source gas.

16. The method of claim 15, wherein the silicon halide is a chloride compound.

17. The method of claim 16, wherein the chloride compound is a compound selected from a group consisting of tetrachlorosilane and trichlorosilane.

18. The method of claim 9, wherein the forming the periodic structure comprises:

forming the cell site gate insulator on the semiconductor substrate;

forming the first conductive layer on the cell site gate insulator;

forming an end point monitoring film on the first conductive layer, the end point monitoring film having different etching behavior from the device isolation film;

forming a masking film on the end point monitoring film, the masking film having the same etching behavior as the device isolation film;

delineating the masking film so as to form an etching mask;

selectively etching the end point monitoring film, the first conductive layer, the cell site gate insulator and an upper portion of the semiconductor substrate so as to form a plurality of device isolation grooves running along the column-direction, defining a plurality of the second ridges arranged alternatively between device isolation grooves;

blanket forming the device isolation film so as to fill in the device isolation grooves;

planarizing a top surface of the device isolation film so as to expose periodically a plurality of top surfaces of the end point monitoring films; and etching selectively the end point monitoring films, employing a difference of etching behaviors.

19. The method of claim 18, after etching selectively the end point monitoring films, further comprising:

planarizing the top surface of the device isolation film so as to expose periodically a plurality of top surfaces of the first conductive layer; and removing selectively exposed top surfaces of the first conductive layers so that each of the top surfaces of the first conductive layers manifests a curved surface such that both edges of the curved surface are higher than a level of a central portion of the curved surface.

20. The method of claim 9, wherein each of the inter-electrode dielectrics is a single layer film selected from the group cansisting of an silicon oxide film, a silicon nitride film, an aluminum oxide film, a hafnium oxide film and a zirconium oxide film or a composite film including at least one of the single layer film.

* * * * *